United States Patent [19]

Flegel et al.

[11] 4,259,278
[45] Mar. 31, 1981

[54] METHOD OF RESHAPING WARPED GRAPHITE ENCLOSURES AND THE LIKE

[75] Inventors: Vernon Flegel, Coleman; Robert J. Anthony, Bay City, both of Mich.

[73] Assignee: Ultra Carbon Corporation, Bay City, Mich.

[21] Appl. No.: 55,995

[22] Filed: Jul. 9, 1979

[51] Int. Cl.³ ............................................. F27B 14/10
[52] U.S. Cl. ........................................ 264/81; 264/82; 264/234; 264/235; 428/408
[58] Field of Search ................... 264/81, 82, 234, 235; 428/408

[56] References Cited

U.S. PATENT DOCUMENTS

| | | | |
|---|---|---|---|
| 2,734,800 | 2/1956 | Brooks | 23/209.9 |
| 2,776,131 | 1/1957 | Marino | 432/265 |
| 3,131,920 | 5/1964 | Reinker et al. | 432/265 |
| 3,236,921 | 2/1966 | Sermon | 264/0.5 |
| 3,351,690 | 11/1967 | Stover | 264/235 |
| 3,416,895 | 12/1968 | Leistner et al. | 23/209.9 |
| 3,759,670 | 9/1973 | Rummel | 422/249 |
| 3,899,575 | 8/1975 | Tokushige et al. | 423/448 |
| 3,961,905 | 6/1976 | Rice | 432/265 |
| 3,980,105 | 9/1976 | Myskowski | 428/408 |
| 4,005,163 | 1/1977 | Bokros | 264/81 |
| 4,052,153 | 10/1977 | Borer et al. | 432/265 |
| 4,055,391 | 10/1977 | Schmidt et al. | 432/265 |
| 4,102,960 | 7/1978 | Borkowski | 264/82 |
| 4,147,814 | 4/1979 | Yatsurugi et al. | 264/81 |

*Primary Examiner*—Maurice J. Welsh
*Attorney, Agent, or Firm*—Learman & McCulloch

[57] ABSTRACT

Warped, spread apart, graphite enclosures of the type used with crucibles for "pulling" crystalline bodies, and the like are restored substantially to original "set" condition by compressing them and holding them in substantially their original shape while heating them to temperatures which result in vaporization of the crystalline material and the carbon compounds which have deposited or formed on the enclosure, holding them at the elevated temperatures for a period of time sufficient to volatilize, and permit removal of all, save perhaps a minor residuum, of these materials, and then cooling the enclosure. Alternatively, the heating can be accomplished in a reactive furnace which also reacts a halogen or the like with the material to be removed.

12 Claims, 6 Drawing Figures

METHOD OF RESHAPING WARPED GRAPHITE ENCLOSURES AND THE LIKE

BACKGROUND OF THE INVENTION

In the Czochralski process for drawing or pulling single crystals from a seed crystal, a susceptor enclosure also known as a crucible support or holder, is often utilized as the surrounding wall of a rotary melt containing crucible which usually is provided with a quartz liner. Because of the high temperatures involved in the crystal pulling process, a slit or gap is provided in the susceptor wall which extends from end to end thereof to permit thermal expansion and contraction thereof. Typically, such susceptors may be eleven inches in diameter (outer) and have a 3/4 inch wall thickness, and the slit may be 1/4 inch in width. In practice, it has been found that such susceptors have a relatively short service life and must be replaced after three to four crystal pulling runs because the susceptor sleeves do not return to original shape upon cooling but tend to progressively expand with each run to the extent that they finally contact the heating element which surrounds them. This occurs if a typical graphite sleeve of this size warps such that the slit gap expands much beyond ½ inch.

The reasons for the progressive expansion which takes place in the graphite sleeve, are not fully known but, we feel, are the result of a bi-metal strip-like response at high temperatures between the outer diameter boundary surface of the susceptor (which comprises, after some use in growing silicon crystals, for instance, an uneven lattice of silicon carbide and free silicon) and the graphite wall. Silicon vapor freed in this crystal growing process tends to be drawn into the pores of the graphite susceptors and to be deposited as an outer coating in the form of free silicon. At the same time, the inner deposition of silicon and the release of silicon monoxide vapor from the liner converts some of the boundary graphite to silicon carbides at the high temperatures involved in the process. When the enclosure is cooled to ambient room temperature, its propensity to return to its original set or shape has been affected and, with repeated heating and cooling, this spread of the susceptor is progressive.

The principal object of the invention is to provide a method of restoring such graphite enclosure shapes, which are quite expensive, and to do so in an economical manner. Surprisingly, it has been reported to us that a restored susceptor has a longer life, i.e., seven to eight runs, than originally. For some reason its progressive expansion, after restoration, is more gradual.

SUMMARY OF THE INVENTION

The out-of-shape split graphite sleeve is, first of all, cold compressed to original shape and then elevated to a temperature such as to volatilize the materials which have caused it to warp. The vaporization of the materials occurs in an oxygen free atmosphere and the materials are removed from the vicinity of the enclosure. After cooling the enclosure returns to a set in its original shape and is more resistant to the warpage than formerly.

The various objects and advantages of the invention will become apparent in the following specification in which certain embodiments of the invention are disclosed, and in the accompanying drawings.

BRIEF DESCRIPTION OF THE DRAWINGS

For a fuller understanding of the nature and objects of the invention, reference should be had to the following detailed description taken in connection with the accompanying drawings in which.

Figure 1:
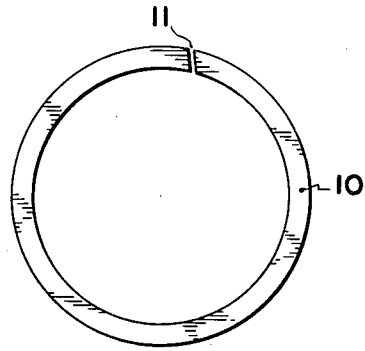
FIG. 1 is a top plan view showing the susceptor sleeve in original condition.
Figure 2:
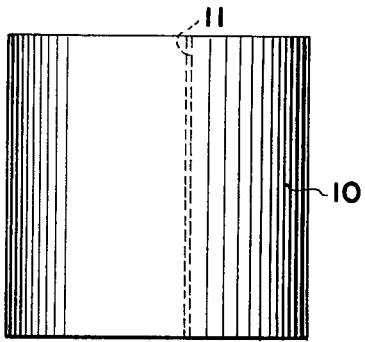
FIG. 2 is a side elevational view thereof.

Referring now more particularly to the accompanying drawings, the susceptor sleeve shown at 10 is preferably formed in the first place from purified graphite stock and machined to size and to form the slit 11 therein as shown in FIGS. 1 and 2. While there is no intention to limit the disclosure herein to any particular form of graphite, for purposes of illustration only, it may be considered that the graphite article could be prepared in the manner disclosed in the present assignee's prior U.S. Pat. No. 3,236,921. Normally to form graphite stock of this type an amorphous, particulate, mined graphite is mixed with coal tar pitch and the raw mixture is placed in a mixer and thoroughly blended while being heated relatively slowly to a temperature in the neighborhood of 165° C. As the composition is being heated, its constituents are intimately blended in the mixer and certain liquid hydrocarbons are distilled. When the mass becomes substantially solidified it is removed from the mixer, pulverized, and screened. Thereafter the product may be heated to a plastic state, and extruded to stock shape. Thereafter the product is slowly baked in an oven in an inert atmosphere and raised gradually to a relatively high temperature. During this baking operation, the pitch is heated to its carbonization range and is reduced to free carbon or coke such that it provided what may be termed a free carbon bond at pitch carbonization temperatures in the range 775°–1350° C. Thereafter the product is raised to graphitization temperatures in the range 2000° to 2600° C. which may require baking time of as much as twelve hours or more. Finally the product is slowly cooled to room temperature. This method of preparing graphite stock is well known in the trade and it is intended only as an example of how the susceptor top or sleeve may be formed.

As indicated previously, when such sleeves are used in the Czochralski process for growing monocrystalline bodies at high temperatures, a certain progressive warpage is noticed with each successive crystal pulling run. Each time the top 10 is heated to crystal pulling temperatures, which are the melt temperatures of the crystalline material involved in the crystal pulling process, (for example 1420° C. in the case of silicon) and then cooled down, it has been found that the gap 11 has widened and has not returned to original condition. Thus, with use, there is a progressive widening of gap 11 and an expansion of the sleeve diameter in one direction. Since the susceptor sleeve 10 is in practice surrounded by a resistance heating element, the sleeve 10 is conventionally discarded after a certain predetermined expansion has occurred.

Proceeding on the theory that the warpage might be caused by the formation of carbide materials, and the deposition of crystalline material in a free state, on the surface, and in the pores, of the body 10, we have theorized that, if this material could be removed, the body might be restored to its original "set". We have now tested this theory in practice and found that it indeed works, and that, surprisingly, an article treated by our method will outperform the original product.

Figure 3:
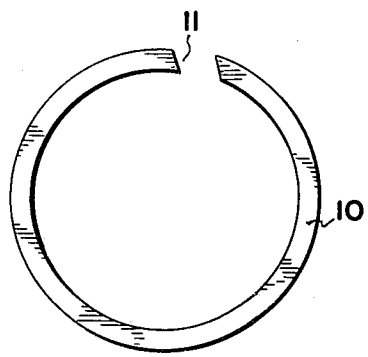
FIG. 3 is a similar top plan view but showing the susceptor sleeve in an opened-up, warped condition.
Figure 4:
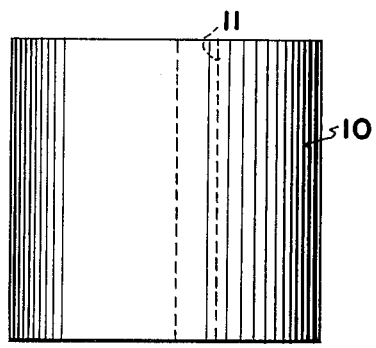
FIG. 4 is a side elevational view thereof.
Figure 5:
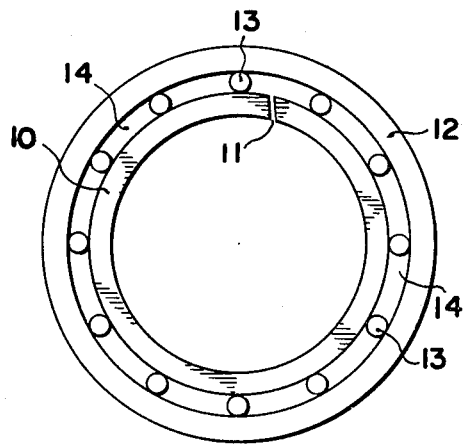
FIG. 5 is a top plan view of a container for the susceptor which is employed for compressing it to original condition at ambient temperature and then holding it while susceptor sleeve is raised to the required elevated temperature.
Figure 6:
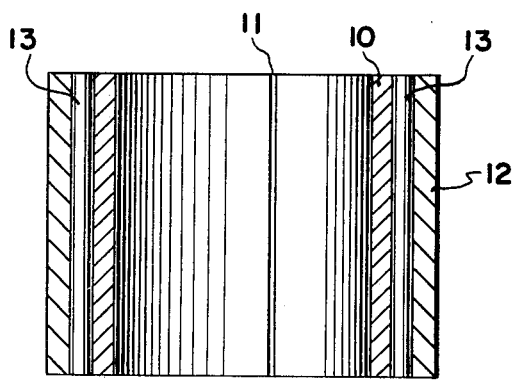
FIG. 6 is a sectional side elevational view thereof.

The present method involves compressing a warped sleeve 10, which has expanded to the condition shown in FIGS. 3 and 4 and remained set in this expanded shape at room temperature, to original shape at ambient room temperature and placing it in the container sleeve 12 shown in FIGS. 5 and 6. Container sleeve 12 is provided with circumferentially spaced axially extending rods 13, which separate the susceptor sleeve 10 from the interior wall of the container 12 and form vapor passages or channels 14 along the wall as shown. Once the sleeve 10 is inserted and held in compressed condition, the container 12 may be placed in a conventional vacuum furnace which has an oxygen free atmosphere. Once placed in the vacuum furnace, the container 12 and its contents are raised slowly to a temperature of preferably 1900° C. over a period of about one hour and held at that temperature for a period of several i.e. two hours. In the case of a sleeve warped in the pulling of monocrystalline silicon, which is coated on the surface of the sleeve 10 and first melts and then vaporizes (at about 1420° C.), and the silicon carbide compounds which have formed as a boundary layer and pass in the form of a sublimate vapor (at about 1500° C.–1900° C.), into the channels 14, the vaporization pressure is sufficient to remove the vapors to the atmosphere of the vacuum furnace from which they may be removed by the vacuum maintaining device. Thereafter, the container sleeve 12 is cooled down over a period of several hours to the point where the sleeve 10 may be removed. The sleeve 10 will be found to have returned to its original "set" shape and, surprisingly, will now be good for six to seven crystal pulling runs before it again warps to the condition illustrated in FIGS. 3 and 4. We theorize that the existance of a sub-surface residuum silicon carbide lattice which does not interfere with the return of the material to original "set" is responsible for this enhanced stability.

In the case of a sleeve 10 warped in the pulling of monocrystalline alpha almuinum oxide, we recommend that the crystal pulling sleeve 10 be heated above the vaporization temperature of the carbides (for example, about in the range 2050°–2500° C.), which have formed on the boundary layer of the sleeve and the same thing is true in the case of sleeves 10 used in the drawing of gadolinium-gallium garnet crystals (for example about in the range 1750°–2200° C.). Graphite sleeves 10 used for germanium crystal pulling or gallium arsenide or phosphide pulling should also lend themselves to recycling in this manner.

Alternatively, to the use of a vacuum furnace as described, the container 12 may be placed in the petroleum coke bed of a conventional graphite purification furnace which is swept by a halogen gas such as "freon 12" (difluoro-dichloromethane) in the manner, for instance, disclosed in the present assignee's U.S. Pat. No. 3,416,895. In this type of furnace, "freon 12" is introduced when the bed reaches a temperature of about 500° C. and held until the bed reaches a temperature of about 2500° C. A chemical reaction of the free silicon and silicon carbides with the difluoro-dichloromethane occurs at temperatures lower than the sublimation temperature of the carbides, i.e. in the 1420° C. range for silicon, and some of this material is removed in the form of halogenated vapor before the sublimation temperature is reached. In a furnace of this type nitrogen gas is utilized as a sweep in the manner described in U.S. Pat. No. 3,416,895, to remove the gases given off. Typically, the furnace may be that disclosed in the present assignee's U.S. Pat. No. 2,734,800. In this furnace, in which the container sleeve 12 is buried in the petroleum coke bed, the furnace is slowly raised to the temperature of "freon 12" introduction over a period of about two and one half hours and "freon 12" is introduced while the heating continues for a period of about six hours. At this point, the heating can be stopped and the "freon 12" replaced with nitrogn gas, while the furnace is allowed to cool slowly in the manner described in these patents. A purification of the sleeve 10 and the container 12, insofar as contaminants are concerned, is achieved to a greater degree than in the vacuum furnace. Still another alternative is possible, and that is the use of the furnace described in U.S. Pat. No. 3,416,895 without introducing and halogenating agent. The alternative procedure should also be possible with the other monocrystallines mentioned.

It is to be understood that the drawings and descriptive matter are in all cases to be interpreted as merely illustrative of the principles of the invention rather than a limiting the same in any way, since it is contemplated that various changes may be made in the various elements to achieve like results without departing from the spirit of the invention or the scope of the appended claims.

We claim:

1. A method of reshaping warped graphite susceptor enclosures which are split and whose confronting split edges have spread apart with repeated exposure to monocrystalline vapor influences comprising:
    (a) compressing the enclosure to move the confronting edges to a less spaced apart condition,
    (b) holding the enclosure in said compressed condition while heating it from the temperature at which it was compressed to a higher temperature sufficient to cause the vaporization of the monocrystalline material and the monocrystalline material carbide compounds resident as a boundary layer on the outer surface of the enclosure to drive off those materials sufficiently to cause the graphite enclosure to return substantially to its original set condition when cooled,
    (c) and cooling the enclosure.

2. The method of claim 1 in which the enclosures are cold compressed at ambient room temperature.

3. The method of claim 1 in which the heating takes place in an oxygen free atmosphere.

4. The method of claim 1 in which the heating takes place in a halogen gas atmosphere.

5. The method of claim 1 in which the heating is accomplished by burying the enclosure in a heated particulate furnace bed and exposing the enclosure to halogen gas flow.

6. The method of claim 5 in which the gas is difluorodichloromethane.

7. The method of claim 1 wherein the enclosure is placed in an open-ended sleeve container and axially extending rods circumferentially spaced around the container are used to compress the enclosure and form circumferentially spaced axially extending gas evolution channels within the container.

8. A method of reshaping warped graphite susceptor sleeve enclosures which are split and whose confronting split edges have spread apart as a result of the formation of silicon carbides and silicon vapor on the exterior cylindrical surface of the sleeve and the deposition of free silicon thereon and in the pores of the sleeve, comprising:

(a) cold compressing the enclosure to move the confronting edges to a less spaced apart location by placing the enclosure within a graphite sleeve container;

(b) heating the susceptor sleeve and container to a temperature at which vaporization of the free silicon and the silicon-carbon compounds occurs for a time sufficiently to drive these materials off;

(c) removing the vapor from the vicinity of the container and susceptor sleeve;

(d) cooling the susceptor sleeve and container;

(e) and removing the susceptor sleeve from the container in a state in which it repossesses its original set and is more resistant to such warpage than originally.

9. The method of claim 8 in which the heating takes place in a halogen gas atmosphere and silicon fluoride and chloride vapors are formed.

10. The method of claim 8 in which the heating is accomplished by burying the container in a particulate petroleum coke furnace bed and piping a halogen gas into the bed, while raising the bed to elevated temperatures.

11. A product comprising: a formerly warped graphite susceptor enclosure having confronting split edges which were formerly in unduly spaced condition due to the original enclosure assuming an expanded warped set, because of monocrystalline material and monocrystalline material carbide compounds resident on the boundary outer layer of the enclosure; the formerly warped enclosure having been compressed to substantially present shape and then heated to a higher temperature sufficient to cause the vaporization of the monocrystalline material and the monocrystalline material carbide compounds sufficiently so that the enclosure was reset in a condition in which it is more resistant to further warpage than the original product.

12. The product of claim 11 in which the monocrystalline material was silicon vaporized off in crystal pulling.

* * * * *